(12) United States Patent
Douskey et al.

(10) Patent No.: US 7,890,824 B2
(45) Date of Patent: Feb. 15, 2011

(54) ASYNCHRONOUS COMMUNICATION APPARATUS USING JTAG TEST DATA REGISTERS

(75) Inventors: Steven Michael Douskey, Rochester, MN (US); Michael John Hamilton, Rochester, MN (US); Brandon Edward Schenck, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 12/178,776

(22) Filed: Jul. 24, 2008

(65) Prior Publication Data

US 2010/0023820 A1    Jan. 28, 2010

(51) Int. Cl.
*G01R 31/28* (2006.01)
(52) U.S. Cl. .................................... 714/727
(58) Field of Classification Search ............... 714/726, 714/727, 729
See application file for complete search history.

(56) References Cited

U.S. PATENT DOCUMENTS

| | | | |
|---|---|---|---|
| 5,490,097 A | 2/1996 | Swenson et al. | |
| 6,115,763 A | 9/2000 | Douskey et al. | |
| 6,145,100 A | 11/2000 | Madduri | |
| 6,519,729 B1 * | 2/2003 | Whetsel | 714/727 |
| 6,539,491 B1 | 3/2003 | Skergan et al. | |
| 6,728,915 B2 | 4/2004 | Whetsel | |
| 6,948,147 B1 | 9/2005 | New et al. | |
| 7,013,415 B1 * | 3/2006 | Kamei et al. | 714/729 |
| 7,032,146 B2 | 4/2006 | Ayers, Sr. | |
| 7,085,706 B1 | 8/2006 | McGettigan et al. | |
| 7,284,170 B2 | 10/2007 | Whetsel | |
| 7,322,000 B2 | 1/2008 | Colunga et al. | |
| 7,480,843 B1 * | 1/2009 | Jacobson | 714/725 |
| 7,538,574 B1 | 5/2009 | Tang et al. | |
| 7,627,797 B2 * | 12/2009 | Miner et al. | 714/726 |
| 7,737,723 B1 | 6/2010 | Tang et al. | |
| 2005/0204225 A1 | 9/2005 | Whetsel | |
| 2006/0236174 A1 | 10/2006 | Whetsel | |
| 2007/0101217 A1 | 5/2007 | Whetsel, Jr. et al. | |
| 2007/0288820 A1 | 12/2007 | Whetsel | |
| 2008/0005633 A1 | 1/2008 | Whetsel | |

* cited by examiner

*Primary Examiner*—James C Kerveros
(74) *Attorney, Agent, or Firm*—Toler Law Group

(57) ABSTRACT

An adaptation of a test data register (TDR) structure defined by the IEEE 1149.1 Joint Tag Action Group (JTAG) interface standard to provide a debugging path. Existing multi-core processor solutions are covered, but an expansion for a more generic solution is provided. In general, the present apparatus is for extending the IEEE 1149.1 JTAG standard to provide an asynchronous protocol for bypassing test circuitry and bi-directionally communicating with functional circuitry. The apparatus includes an integrated circuit having function register and JTAG standard TDR. Digital logic is configured to control the direct transfer of data between the JTAG standard TDR and the function register.

20 Claims, 3 Drawing Sheets

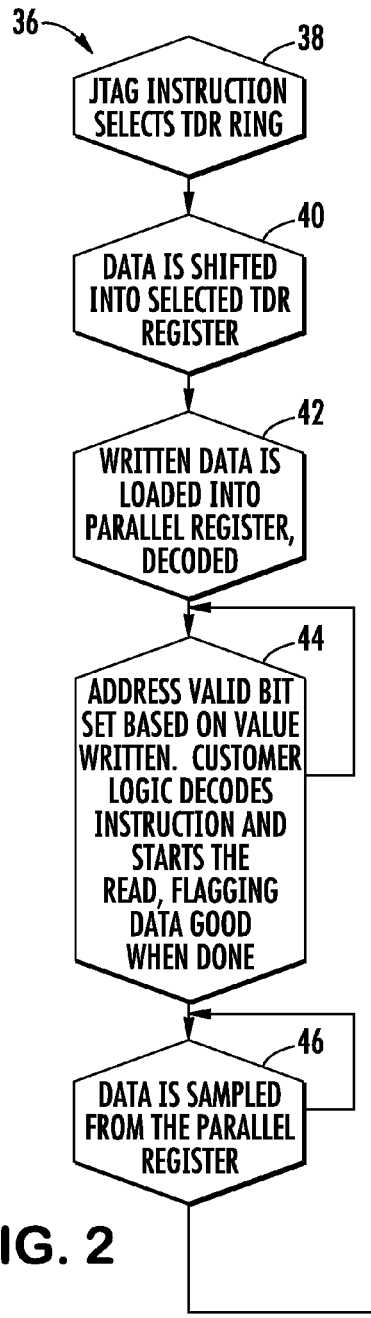
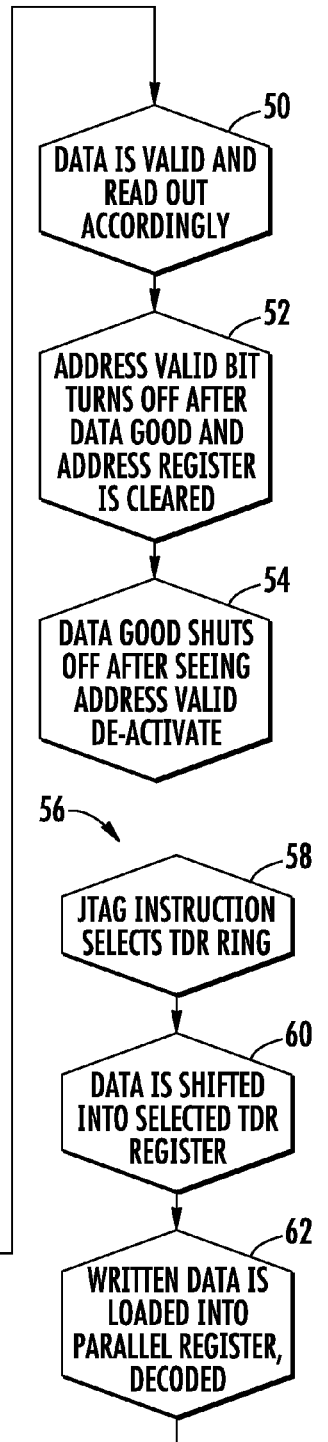
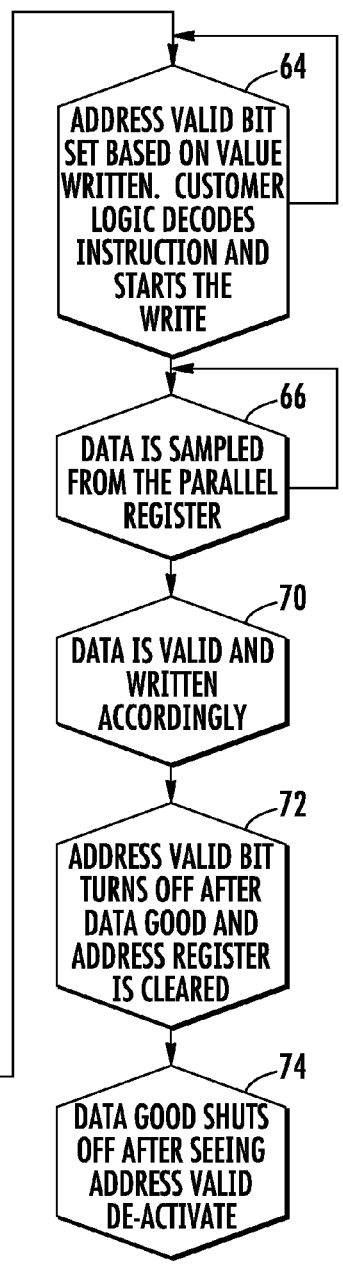
FIG. 2
FIG. 3

ASYNCHRONOUS COMMUNICATION APPARATUS USING JTAG TEST DATA REGISTERS

RELATED APPLICATIONS

The present application relates to co-pending U.S. patent application, entitled "Asynchronous Communication Using Standard Boundary Architecture Cells" by the present inventors, Steven Michael Douskey, Michael John Hamilton, and Brandon Edward Schenck. The co-pending application is filed concurrently herewith, and is incorporated by reference in its entirety.

FIELD OF THE INVENTION

The present invention relates generally to the IEEE 1149.1 Joint Test Action Group (JTAG) standards, and more particularly, to facilitating communications between integrated circuit components using JTAG standards.

BACKGROUND OF THE INVENTION

The IEEE 1149.1 JTAG interface was developed to facilitate external access to integrated circuit devices. A JTAG-compatible integrated circuit device typically includes a standardized test access port (TAP) that allows boundary scan operations to be performed by an external TAP controller via the TAP port of the device. All test result outputs may be sent back through the same TAP port.

The standardized JTAG interface originally was used to test printed circuit boards and later found use in testing individual integrated circuits. However, due to their complexity, core-based integrated circuit design has introduced new complexities in that the number of transistors has increased at a greater rate than I/O pins. Therefore, standard test data register (TDR) cells have been developed that may be grown directly on the integrated circuit. Thus, cell-based TDRs may be placed generally wherever they are needed along the boundary of the integrated circuit's functional circuitry boundary. For the purposes of this disclosure, a cell-based integrated circuit design may be implemented by a circuit designer that lays out an integrated circuit design by connecting together a number of predefined cells. Each cell may include a plurality of transistors that have been integrated together to perform a predefined function. Cells may be maintained in a library, so that a designer may often build a design simply by assembling together cells of transistors rather than laying out each transistor individually.

Conventional designs implement a full Scan Communications bus with a unique protocol to handle the debug logic needed for communication. However, the SCom solution, having a similar register addressed structure, has an additional level of clock latency, as well as similar global wiring and area congestion issues.

What is consequently needed is an asynchronous communication mechanism that allows a user to implement their unique internal register-addressed protocol, typically at a chip system speed, and allows data to be asynchronously transferred to and from a JTAG controller at the JTAG interface speed.

SUMMARY OF THE INVENTION

The present invention provides an improved computer implemented method, apparatus and program product for an apparatus for extending the JTAG standard to provide an asynchronous protocol for bypassing test circuitry and bi-directionally communicating with functional circuitry. An embodiment consistent with the invention may comprise an integrated circuit having at least one function register and at least one JTAG standard TDR, and digital logic configured to control the direct transfer of data between the at least one JTAG standard TDR and the at least one function register. The at least one JTAG standard TDR may include data bits for representing data to be written or read from the at least one function register.

According to an aspect of the invention, the at least one JTAG standard TDR may include a READ/WRITE bit for indicating the direction of data flow and a DATA GOOD signal having a timing delay that is sufficient to guarantee the data represented by the data bits is stable. The at least one JTAG standard TDR may include address bits for addressing the at least one function register. An ADDRESS VALID bit for indicating the correctness of the values held by the at least one JTAG standard TDR address bits may also be included.

Embodiments consistent with the underlying principles of the present invention may include a JTAG standard TDR that is configured to be serially loadable. A parallel JTAG standard TDR in communication with the serially loadable at least one JTAG standard TDR may also be included.

Another aspect of the invention may provide a method of using an extendable JTAG standard interface to provide an asynchronous protocol for bypassing test circuitry and bi-directionally communicating with functional circuitry, the method comprising steps of providing an integrated circuit having at least one function register and JTAG standard TDR ring having a plurality of serial TDRs and corresponding parallel TDRs that include data bits, address bits and an ADDRESS VALID bit, and providing digital logic configured to control the direct transfer of data between the JTAG standard TDR ring and the at least one function register, the digital logic including a DATA GOOD signal.

Aspects of the invention may further include method steps for reading data from the at least one function register, the method steps comprising issuing a JTAG instruction to select a desired serial TDR from the TDR ring, shifting the address of the readable data into the selected serial TDR, shifting a corresponding ADDRESS VALID bit, loading the address of the readable data from the selected serial TDR into a parallel TDR corresponding with the selected serial TDR, loading the readable data from the at least one function register into the serial TDR, and testing the corresponding DATA GOOD signal until the readable data in the serial TDR is valid by continuously shifting the data out of the selected serial TDR until the DATA GOOD bit is set.

Embodiments consistent with the invention may include the clearing of the ADDRESS VALID bit after the DATA GOOD signal and address bits are cleared, and turning off the DATA GOOD signal after the ADDRESS VALID bit is cleared. Other steps may include issuing a JTAG instruction to select a desired serial TDR from the TDR ring, shifting the address of the writable data into the selected serial TDR, shifting the writable data into the selected serial test data register, shifting a corresponding ADDRESS VALID bit once address and data loading is complete, loading the address of the writable data from the selected serial TDR into a parallel TDR corresponding with the selected serial TDR, loading the writable data from the selected serial TDR into the parallel TDR, loading ADDRESS VALID, loading the writable data into the at least one function register, and testing the corresponding DATA GOOD signal until the writable data in the parallel test data register is valid.

Aspects of the invention may include an apparatus for extending the JTAG standard to provide an asynchronous protocol for bypassing test circuitry and bi-directionally communicating with functional circuitry, the apparatus comprising an integrated circuit having at least one function register and at least one JTAG standard TDR, wherein the at least one JTAG standard TDR includes data bits for representing data to be written to or read from the at least one function register, and digital logic configured to control the direct transfer of data between the at least one JTAG standard TDR and the at least one function register.

According to an embodiment consistent with the invention, the JTAG standard TDR may include a READ/WRITE bit for indicating the direction of data flow. A DATA GOOD signal having a timing delay that is sufficient to guarantee the data represented by the data bits is stable may also be included. The JTAG standard TDR may include address bits for addressing the at least one function register. Also included may be an ADDRESS VALID bit for indicating the correctness of the values held by the at least one JTAG standard TDR address bits. The JTAG standard TDR may be configured to be serially loadable. A parallel JTAG standard TDR may be included that is in communication with the serially loadable JTAG standard TDR.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

BRIEF DESCRIPTION OF THE DRAWINGS

FIG. 2 shows a flowchart including steps executed by the architecture of FIG. 1 for a read data sequence using communications handshaking in accordance with the underlying principles of the present invention.

FIG. 3 is a flowchart including steps executed by the architecture of FIG. 1 for a write data sequence using communications handshaking in accordance with the underlying principles of the present invention.

DETAILED DESCRIPTION

Figure 1:
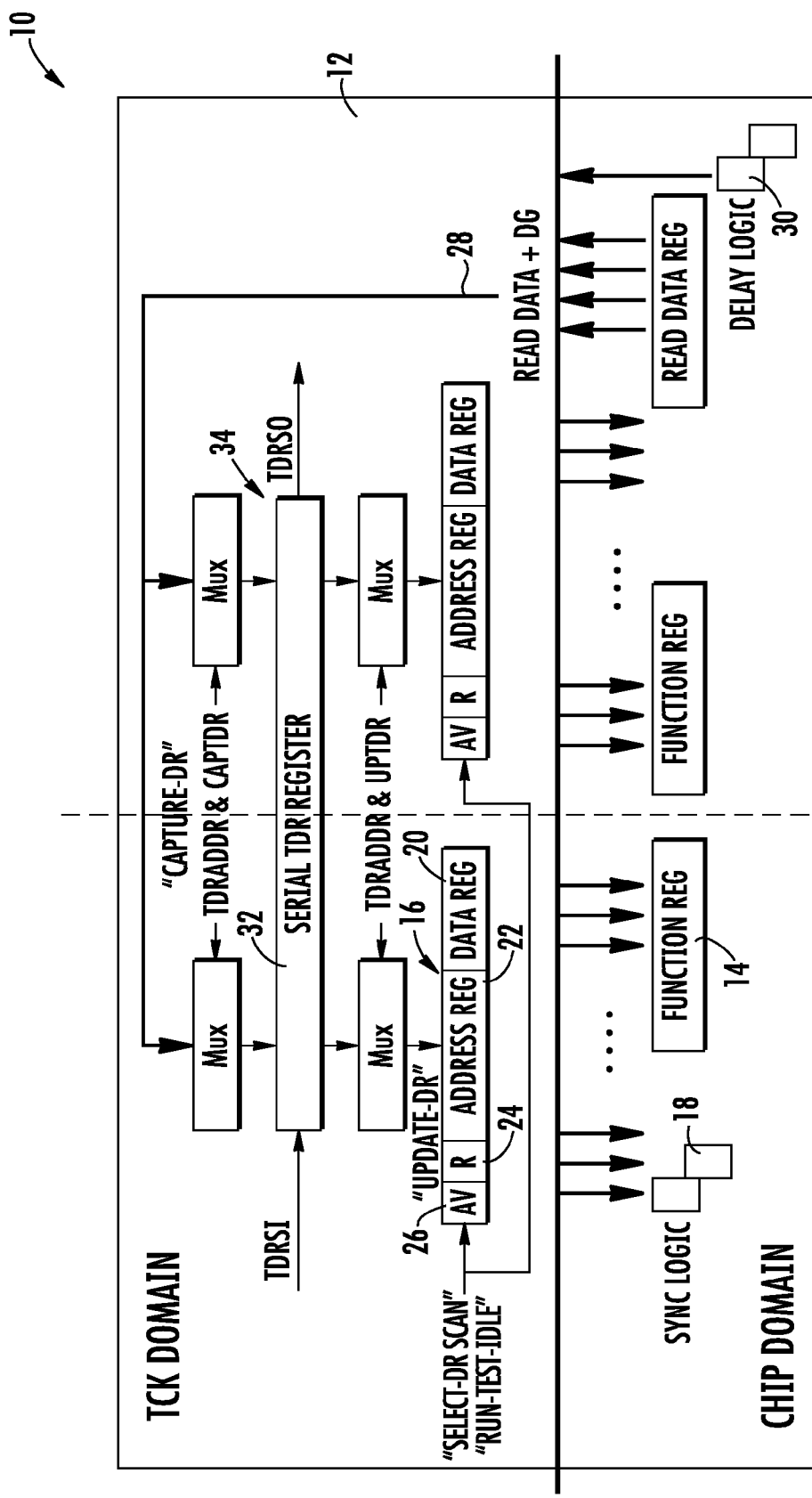
FIG. 1 is a block diagram depicting a TDR architecture that allows communication with an integrated circuit's functional circuitry in accordance with the underlying principles of the present invention.

Embodiments consistent with the invention may allow for general purpose I/O communication through a standard JTAG interface without altering standard JTAG functions. Aspects of the invention provide asynchronous communication between a JTAG macro and a customer's integrated circuit communication logic.

Aspects of the invention may adapt a TDR structure defined by the JTAG interface standard to provide a debugging path. Existing multi-core processor solutions may be included, and an expansion for a more generic solution is provided. In general, embodiments may extend the JTAG standard to provide an asynchronous protocol for bypassing test circuitry and bi-directionally communicating with functional circuitry. Aspects may include an integrated circuit having function register and JTAG standard TDR. Digital logic is configured to control the direct transfer of data between the JTAG standard TDR and the function register.

Embodiments consistent with the present invention provide an interface that is an extension to the JTAG standard that allows for an asynchronous protocol into the user's (i.e., customer's) existing logic. This interface may be implemented by adding several TDRs that communicate with customer addressed registers within their core logic. In particular, the 1149.1 JTAG TAP controller is used, with additional synchronization logic, to provide an extendable interface that does not alter the standard JTAG functions.

More specifically, embodiments consistent with the invention introduce a serial TDR with one or more matching parallel TDRs. For the purpose of this disclosure, a serial TDR may be loaded with data in a serial manner and a parallel TDR may be loaded with data in a parallel manner. All address and data flow to the customer logic is through these TDRs and back into a JTAG macro that orchestrates the overall communication process.

A provided ADDRESS parallel TDR may reserve two bits for READ/WRITE control and ADDRESS VALID bits. A DATA parallel TDR may be provided to hold data that is to be written into the customer logic during data write sequences. These two TDRs may optionally be combined into one, larger register. A third register within the customer logic may be used to hold the read data from the customer logic. An additional bit of this third register serves as a DATA GOOD flag. The DATA GOOD indicator includes a timing delay that is sufficient to guarantee the read data is stable, thus correct. Customer logic on the customer's integrated circuit core typically operates at a clock speed that is different than the JTAG interface. Therefore, care may be taken to capture any external TDR contents correctly. Since the address, read/write bit, and the data (during a data write sequence) are set up in advance, only the ADDRESS VALID bit may be synchronized to the customer's core clock.

The following steps involving communications handshaking are taken during a typical data write operation according to an embodiment of the present invention: first, data may be loaded into a WRITE DATA Register, ADDRESS Register along with setting of the READ/WRITE bit to logic zero during an UPDATE-DR state of the TAP controller. Second, the ADDRESS VALID bit is set to logic one at one TCK cycle later upon entering a RUN-TEST-IDLE state. Third, the ADDRESS VALID bit may remain active until the TAP controller leaves the RUN-TEST-IDLE state, so it must be captured in customer logic before the later TCK cycle. Looping in the RUN-TEST-IDLE state may prolong the setup significantly, often because TCK is much slower than the functional clocks of the customer's core. The TDR DATA REGISTER, ADDRESS REGISTER and READ/WRITE bit may remain until a new instruction is loaded, but are assumed invalid when the ADDRESS VALID bit turns off. Once the ADDRESS VALID bit is captured synchronously in logic, the write is triggered to the appropriate register in the customer's integrated circuit.

The following steps involving communications handshaking are taken during a typical data read operation according to embodiments of the present invention: first, the ADDRESS Register is loaded with the address of the customer's register to be read along with setting of the READ/WRITE bit to logic one during an UPDATE-DR state of the TAP controller. Second, the ADDRESS VALID bit is set to logic one at one TCK cycle later upon entering a RUN-TEST-IDLE state. Third, the ADDRESS VALID bit remains active until the TAP controller leaves the RUN-TEST-IDLE state, so it must be captured in customer logic before the later TCK cycle. Looping in the RUN-TEST-IDLE state may prolong the setup significantly, often because TCK is much slower than the functional clocks of the customer's core. The TDR DATA REGISTER, ADDRESS REGISTER and READ/WRITE bit will remain until a new instruction is loaded, but are assumed invalid when the ADDRESS VALID bit turns off. Fourth, once the ADDRESS VALID bit is captured synchronously in logic, the read may be triggered. The addressed register in the customer's integrated circuit may present the READ data. Fifth, the READ DATA may be loaded into the TDR during the CAPTURE-DR state. If the DATA GOOD bit is not set to logic one, repeated loops through CAPTURE-DR may be made until it sets to logic one. Once DATA GOOD is set, the ADDRESS VALID bit (and optionally the ADDRESS register) may be cleared.

Variations in the communications handshaking design and sequencing may include, but are not limited to the following steps: First, WRITE DATA and ADDRESS may be loaded in two separate operations, though WRITE DATA should be loaded first. Second, the WRITE DATA and ADDRESS may be captured in the customer's integrated circuit (i.e., chip domain) and later be written to the desired location, removing much of the dependency on TCK. Third, the ADDRESS VALID bit may be loaded at the same time as the ADDRESS, but should be delayed by the customer's integrated circuit logic long enough to ensure valid capture of ADDRESS and WRITE DATA (at least as long as the longest ADDRESS and WRITE DATA delay path.

Turning now to the Drawings, wherein like numbers denote like elements throughout the several views. FIG. 1 illustrates an apparatus according to the present invention for extending the IEEE 1149.1 JTAG standard to provide an asynchronous protocol for bypassing test circuitry and bi-directionally communicating with the functional circuitry of an integrated circuit. The apparatus 10 comprises an integrated circuit 12 having function register 14 and JTAG standard TDR 16. Apparatus 10 further includes digital logic 18 that is configured to control the direct transfer of data between the JTAG standard TDR 16 and the function register 14. The JTAG TDR 16 is preferably a parallel loadable register.

Digital logic 18 is configured to control the direct transfer of data between the JTAG standard TDR 16 and the function register 14. Moreover, the JTAG standard TDR 16 includes data bits 20 for representing data to be written to or read from its function register 14. The JTAG standard TDR 16 also includes address bits 22 for addressing its associated function register 14.

A READ/WRITE bit 24 for indicating the direction of data flow is also included with JTAG standard TDR 16. Further still, an ADDRESS VALID bit 26 is included for validating the correctness of the address held by address bits 22. Moreover, a DATA GOOD signal 28 is an indicator that has a timing delay 30 that is sufficient to guarantee the read data is stable and thus correct. A read register includes a DATA GOOD flag bit that is useable to produce DATA GOOD signal 28. A serial JTAG TDR 32 is a member of a TDR ring 34.

Turning now to FIGS. 2-5, the operation embodiments of the present invention are illustrated. FIG. 2 depicts a typical data read sequence used to read data from an integrated circuit's function register. The read data sequence shown in the flowchart 36 includes communications handshaking in accordance with the principles of the present invention. At block 38, a JTAG instruction issues to select the TDR 32 from the TDR ring 34. At block 40, the system 10 may shift the address of the readable data into a JTAG standard serial TDR 32. The address of the readable data may be loaded at block 42 from the JTAG standard serial TDR 32 into the JTAG standard parallel TDR 16.

A run-test-idle state may be maintained until a corresponding ADDRESS VALID bit is set at block 44, once the address loading is complete. The readable data may be loaded at block 46 from the function register 14 into the JTAG standard serial TDR 32 interfaced via the digital logic interface shown in FIG. 1. A corresponding DATA GOOD signal may be tested until the readable data in the serial TDR 32 is valid. Steps executed at block 50 may shift the readable data out of the TDR ring 34.

Communications handshaking may conclude at blocks 52 and 54. At block 52, the system 10 may, with the DATA GOOD indicator, turn off the ADDRESS VALID bit and clear the address bits. Finally, the DATA GOOD signal may be shut off after seeing the ADDRESS VALID bit clear.

As shown in FIG. 3, a write data sequence of the flowchart 56 includes communications handshaking. At block 58, a JTAG instruction may issue to select TDR 32 from a TDR ring 34. The address of the writeable data may be shifted at block 60 into the JTAG standard serial TDR 32. The address of the writeable data may be loaded at block 62 from the JTAG standard serial TDR 32 into the JTAG standard parallel TDR 16.

A run-test-idle state may be maintained until a corresponding ADDRESS VALID bit is set at block 64, once the address loading is complete. At block 66, the system 10 may sample the writeable data from the JTAG standard parallel TDR 16. The corresponding DATA GOOD signal 28 may be tested until the writeable data in the parallel TDR is valid. Once the data is deemed valid, the writeable data may be loaded at block 70 from the JTAG standard parallel TDR 16 to the function register 14.

Communications handshaking may be accomplished at blocks 72 and 74. The ADDRESS VALID bit may be turned off after the DATA GOOD indicator and the address bits are cleared. The DATA GOOD signal may shut off at block 74 after seeing the ADDRESS VALID bit clear.

Figure 4:
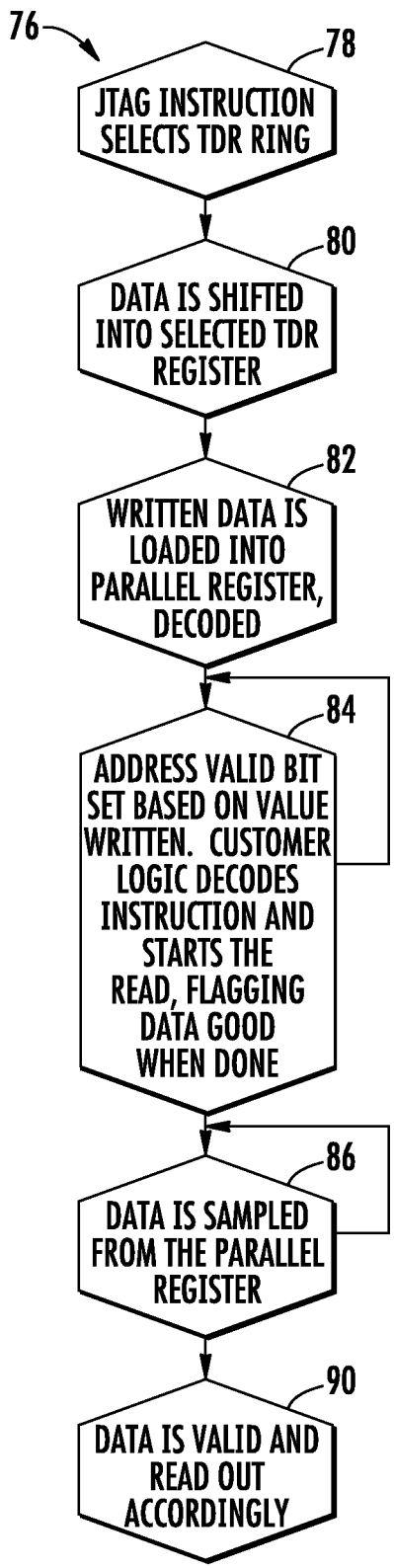
FIG. 4 is a flowchart showing the steps executed by the architecture of FIG. 1 for a write data sequence without using communications handshaking in accordance with the underlying principles of the present invention.

FIG. 4 shows a flowchart 76 comprising a read data sequence without communications handshaking in accordance with the principles of the present invention. A JTAG instruction to select a TDR 32 from boundary scan ring 34 may issue at block 78. The address of the readable data may shift at block 80 into the JTAG standard serial TDR 32. At block 82, the address of the readable data from the JTAG standard serial TDR 32 may load into the JTAG standard parallel TDR 16.

A run-test-idle state may be maintained until a corresponding ADDRESS VALID bit is set at block 84, once the address loading is complete. At block 86, the readable data from the function register 14 may load into the JTAG standard serial TDR 32 interfaced via the digital logic 18 interface shown in FIG. 1

A corresponding DATA GOOD signal 28 is tested in the shifted-out data until the readable data is valid. At block 90 the operation is complete with valid data and DATA GOOD set.

Figure 5:
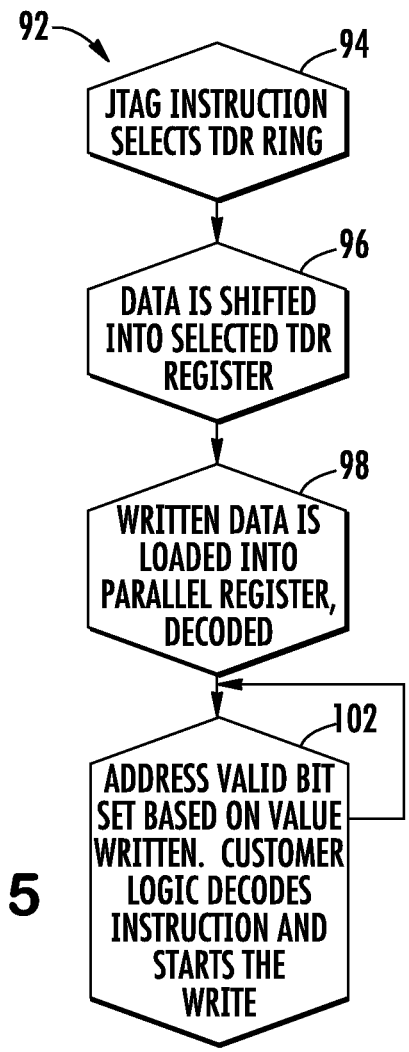
FIG. 5 is a flowchart showing the steps executed by the architecture of FIG. 1 for a read data sequence without using communications handshaking in accordance with the underlying principles of the present invention.

FIG. 5 shows a flowchart 92 including write data sequence without communications handshaking in accordance with the underlying principles of the present invention. A JTAG instruction issues at block 94 to select the TDR 32 from TDR ring 34. At block 96, the address of the writeable data may shift into the JTAG standard serial TDR 32. The address of the writeable data may load at block 98, from the JTAG standard serial TDR 32 into the JTAG standard parallel TDR 16.

A run-test-idle state may be maintained until a corresponding ADDRESS VALID bit is set at block 102, once the address loading is complete. The writeable data may load from the JTAG serial TDR 32 into the JTAG standard parallel TDR 16 interfaced via the digital logic 18 interface shown in FIG. 1. The writeable data from the JTAG standard parallel TDR 16 may load at block 102 to the JTAG standard serial TDR 14.

While the present invention has been illustrated by a description of various embodiments and while these embodiments have been described in considerable detail, it is not the intention of the Applicants to restrict, or, in any way limit the scope of the appended claims to such detail. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. An apparatus for extending the IEEE 1149.1 Joint Test Action Group standard to provide an asynchronous protocol for bypassing test circuitry and bi-directionally communicating with functional circuitry, the apparatus comprising:
    an integrated circuit including:
    at least one function register; and
    at least one Joint Test Action Group standard test data register that includes:
        data bits;
        address bits to address the at least one function register; and
        an ADDRESS VALID bit to indicate correctness of the address bits; and
    digital logic configured to control a direct transfer of the data bits between the at least one Joint Test Action Group standard test data register and the at least one function register, wherein the digital logic is configured to generate a DATA GOOD signal that includes a timing delay configured to facilitate the direct transfer of the data bits from the at least one Joint Test Action Group standard test data register and the at least one function register.

2. The apparatus of claim 1, wherein the data bits represent data to be written or read from the at least one function register.

3. The apparatus of claim 1, wherein the at least one Joint Test Action Group standard test data register includes a READ/WRITE bit for indicating the direction of data flow.

4. The apparatus of claim 1 wherein the timing delay of the DATA GOOD signal is sufficient to guarantee data represented by the data bits is stable.

5. The apparatus of claim 1, wherein the at least one Joint Test Action Group standard test data register is configured to be serially loadable.

6. The apparatus of claim 5, further including at least one parallel Joint Test Action Group standard test data register in communication with the serially loadable at least one Joint Test Action Group standard test data register.

7. The apparatus of claim 6, wherein the ADDRESS VALID bit is set when the address bits are loaded from the serially loadable at least one Joint Test Action Group standard test data register into the at least one parallel Joint Test Action Group standard test data register.

8. The apparatus of claim 1, further including a read data register having a DATA GOOD flag bit.

9. A method of using an extendable IEEE 1149.1 Joint Test Action Group standard interface to provide an asynchronous protocol for bypassing test circuitry and bi-directionally communicating with functional circuitry, the method comprising:
    providing an integrated circuit having at least one function register and Joint Test Action Group standard test data register ring having a plurality of serial test data registers and corresponding parallel test data registers that include data bits, address bits to address the at least one function register and an ADDRESS VALID bit to indicate correctness of the address bits; and
    providing digital logic configured to control a direct transfer of data between the Joint Test Action Group standard test data register ring and the at least one function register, the digital logic including a DATA GOOD signal that includes a timing delay configured to facilitate the direct transfer of the data bits from the at least one Joint Test Action Group standard test data register and the at least one function register.

10. The method according to claim 9, further including:
    issuing a Joint Test Action Group instruction to select a serial test data register from the test data register ring;
    shifting an address of the data into the serial test data register;
    loading the address of the data from the serial test data register into a parallel test data register corresponding to the serial test data register;
    setting the ADDRESS VALID bit when address loading is complete;
    loading the data from the at least one function register into the serial test data register;
    testing the DATA GOOD signal until the data in the serial test data register is valid; and
    shifting the data out of the selected serial test data register.

11. The method according to claim 10, further including:
    clearing the ADDRESS VALID bit after the DATA GOOD signal and address bits are cleared; and
    turning off the DATA GOOD signal after the ADDRESS VALID bit is cleared.

12. The method according to claim 9, further including:
    issuing a Joint Test Action Group instruction to select a serial test data register from the test data register ring;
    shifting an address of the data into the serial test data register;
    shifting the data into the serial test data register;
    shifting the ADDRESS VALID bit once address and data loading is complete;
    loading the address of the data from the serial test data register into a parallel test data register corresponding to the serial test data register;
    loading the data from the serial test data register into the parallel test data register;
    loading the ADDRESS VALID bit;
    loading the data into the at least one function register; and
    testing the DATA GOOD signal until the data in the parallel test data register is valid.

13. An apparatus for extending the IEEE 1149.1 Joint Test Action Group standard to provide an asynchronous protocol for bypassing test circuitry and bi-directionally communicating with functional circuitry, the apparatus comprising:
    an integrated circuit having at least one function register and at least one Joint Test Action Group standard test data register, wherein the at least one Joint Test Action Group standard test data register includes data bits for representing data to be written to or to be read from the at least one function register, address bits to address the at least one function register, and an ADDRESS VALID bit to indicate correctness of the address bits; and digital logic configured to control the direct transfer of data between the at least one Joint Test Action Group standard test data register and the at least one function register, wherein the digital logic is configured to generate a DATA GOOD signal that includes a timing delay configured to facilitate the transfer of the data bits from the at least one Joint Test Action Group standard test data register and the at least one function register.

14. The apparatus of claim 13, wherein the at least one Joint Test Action Group standard test data register includes a READ/WRITE bit for indicating a direction of data flow.

15. The apparatus of claim 13, the timing delay is sufficient to guarantee the data represented by the data bits is stable.

16. The apparatus of claim 13, further including a read data register having a DATA GOOD flag bit.

17. The apparatus of claim 13, wherein the at least one Joint Test Action Group standard test data register is configured to be serially loadable.

18. The apparatus of claim 17, further including at least one parallel Joint Test Action Group standard test data register in communication with the serially loadable at least one Joint Test Action Group standard test data register.

19. The apparatus of claim 18, wherein the ADDRESS VALID bit is set when the address bits are loaded from the serially loadable at least one Joint Test Action Group standard test data register into the at least one parallel Joint Test Action Group standard test data register.

20. The apparatus of claim 13, wherein the DATA GOOD signal ends after the ADDRESS VALID bit is cleared

\* \* \* \* \*